(12) United States Patent
Cheng et al.

(10) Patent No.: US 7,902,865 B1
(45) Date of Patent: Mar. 8, 2011

(54) COMPRESSION AND DECOMPRESSION OF CONFIGURATION DATA USING REPEATED DATA FRAMES

(75) Inventors: Chan-Chi Jason Cheng, Fremont, CA (US); San-Ta Kow, San Jose, CA (US); Ann Wu, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 691 days.

(21) Appl. No.: 11/941,031

(22) Filed: Nov. 15, 2007

(51) Int. Cl.
*H01L 25/00* (2006.01)
*H03M 5/00* (2006.01)
*G06F 17/50* (2006.01)

(52) U.S. Cl. .............................. 326/41; 341/55; 716/117
(58) Field of Classification Search .............. 326/37–41, 326/47; 716/8, 16; 341/87, 50, 65
See application file for complete search history.

(56) References Cited

U.S. PATENT DOCUMENTS

| | | | |
|---|---|---|---|
| 3,717,851 A | 2/1973 | Cocke | |
| 4,829,475 A | 5/1989 | Ward | |
| 4,899,149 A | 2/1990 | Kahan | |
| 5,099,481 A | 3/1992 | Miller | |
| 5,173,695 A | 12/1992 | Sun | |
| 5,467,087 A | 11/1995 | Chu | |
| 5,563,592 A * | 10/1996 | Cliff et al. ........................ | 341/63 |
| 5,745,734 A | 4/1998 | Craft | |
| 5,754,734 A | 5/1998 | Emeott | |
| 5,768,372 A | 6/1998 | Sung | |
| 5,794,033 A | 8/1998 | Aldebert | |
| 5,805,609 A | 9/1998 | Mote | |
| 5,872,529 A | 2/1999 | Mejia | |
| 5,953,503 A | 9/1999 | Mitzenmacher | |
| 6,028,445 A | 2/2000 | Lawman | |
| 6,038,185 A | 3/2000 | Ng | |
| 6,044,025 A | 3/2000 | Lawman | |
| 6,127,953 A | 10/2000 | Manzardo | |
| 6,191,710 B1 | 2/2001 | Waletzki | |
| 6,304,101 B1 * | 10/2001 | Nishihara ........................ | 326/41 |
| 6,327,634 B1 * | 12/2001 | Statovici ........................ | 710/74 |
| 6,483,342 B2 | 11/2002 | Britton | |
| 6,493,862 B1 * | 12/2002 | Young et al. .................. | 716/117 |
| 6,507,214 B1 | 1/2003 | Snyder | |
| 6,507,943 B1 * | 1/2003 | Kelem ............................ | 326/38 |

(Continued)

OTHER PUBLICATIONS

U.S. Appl. No. 11/054,855, filed Feb. 10, 2005, Ma et al.

(Continued)

*Primary Examiner* — Vibol Tan
*Assistant Examiner* — Dylan White
(74) *Attorney, Agent, or Firm* — Haynes and Boone, LLP

(57) ABSTRACT

Various techniques are provided to compress and decompress configuration data for use with programmable logic devices (PLDs). In one example, a method includes embedding a first data frame comprising a data set from an uncompressed bitstream into a compressed bitstream. The method also includes embedding a first instruction to instruct a PLD to load the first data frame into a data shift register, embedding a second instruction to instruct the PLD to load a first address associated with the first data frame into an address shift register, and embedding a third instruction to instruct the PLD to load the first data frame from the data shift register into a first row of a configuration memory corresponding to the first address. The method further includes identifying a second data frame comprising the data set in the uncompressed bitstream, and embedding fourth and fifth instructions in place of the second data frame.

18 Claims, 6 Drawing Sheets

U.S. PATENT DOCUMENTS

| | | | |
|---|---|---|---|
| 6,525,678 B1 * | 2/2003 | Veenstra et al. | 341/55 |
| 6,563,437 B1 | 5/2003 | Landry et al. | |
| 6,564,285 B1 | 5/2003 | Mills | |
| 6,772,230 B2 | 8/2004 | Chen | |
| 6,785,165 B2 | 8/2004 | Kawahara | |
| 6,885,227 B2 | 4/2005 | Agrawal | |
| 6,903,574 B2 | 6/2005 | Chen | |
| 7,019,577 B2 | 3/2006 | Agrawal | |
| 7,034,599 B1 | 4/2006 | Agrawal | |
| 7,589,648 B1 | 9/2009 | Ma et al. | |
| 7,808,405 B1 | 10/2010 | Chen | |
| 2002/0091905 A1 | 7/2002 | Geiger | |
| 2004/0061147 A1 | 4/2004 | Fujita | |
| 2004/0064622 A1 | 4/2004 | Smith | |
| 2005/0229061 A1 | 10/2005 | Kang | |

OTHER PUBLICATIONS

U.S. Appl. No. 11/533,188, filed Sep. 19, 2006, Cheng, Zheng.
Tang, U.S. Appl. No. 10/809,658, filed Mar. 25, 2004.
Tang, U.S. Appl. No. 11/243,255, filed Oct. 4, 2005.
Chen, U.S. Appl. No. 11/346,817, filed Feb. 3, 2006.
Callahan, U.S. Appl. No. 11/530,620, filed Sep. 11, 2006.
Booth, U.S. Appl. No. 11/494,862, filed Jul. 28, 2006.
Atmel Corporation, AT17LV(A) Series FPGA Configuration Memory, Ref. 0437K-CNFG-May 2003, pp. 1-18.
Atmel Corporation, FPGA Configuration EEPROM Memory, 2322F-CNFG, Jun. 2005, pp. 1-18.
Altera Corporation, Configuring Cyclone II Devices, Cyclone Device Handbook, Jul. 2005, vol. 1, Chapters 13-14, pp. 13-1 to 13-4.

* cited by examiner

| | 195 |
|---|---|
| 310(1) | DATA 1 |
| 410(1) | INSTRUCTION: LOAD DATA FRAME 310(1) INTO DSR |
| 410(2) | INSTRUCTION: LOAD ADDRESS 220(1) INTO ASR |
| 410(3) | INSTRUCTION: LOAD DSR INTO CONFIGURATION MEMORY |
| 410(4) | INSTRUCTION: LOAD ADDRESS 220(4) INTO ASR |
| 410(5) | INSTRUCTION: LOAD DSR INTO CONFIGURATION MEMORY |
| 310(2) | DATA 2 |
| 410(6) | INSTRUCTION: LOAD DATA FRAME 310(2) INTO DSR |
| 410(7) | INSTRUCTION: LOAD ADDRESS 220(2) INTO ASR |
| 410(8) | INSTRUCTION: LOAD DSR INTO CONFIGURATION MEMORY |
| 410(9) | INSTRUCTION: LOAD ADDRESS 220(5) INTO ASR |
| 410(10) | INSTRUCTION: LOAD DSR INTO CONFIGURATION MEMORY |
| 410(11) | INSTRUCTION: LOAD ADDRESS 220(6) INTO ASR |
| 410(12) | INSTRUCTION: LOAD DSR INTO CONFIGURATION MEMORY |
| 410(13) | INSTRUCTION: LOAD ADDRESS 220(N-3) INTO ASR |
| 410(14) | INSTRUCTION: LOAD DSR INTO CONFIGURATION MEMORY |
| 410(15) | INSTRUCTION: LOAD ADDRESS 220(N-2) INTO ASR |
| 410(16) | INSTRUCTION: LOAD DSR INTO CONFIGURATION MEMORY |
| 310(3) | DATA 3 |
| 410(17) | INSTRUCTION: LOAD DATA FRAME 310(3) INTO DSR |
| 410(18) | INSTRUCTION: LOAD ADDRESS 220(3) INTO ASR |
| 410(19) | INSTRUCTION: LOAD DSR INTO CONFIGURATION MEMORY |

⋮

| | |
|---|---|
| 310(N-5) | DATA N-5 |
| 410(M-11) | INSTRUCTION: LOAD DATA FRAME 310(N-5) INTO DSR |
| 410(M-10) | INSTRUCTION: LOAD ADDRESS 220(N-5) INTO ASR |
| 410(M-9) | INSTRUCTION: LOAD DSR INTO CONFIGURATION MEMORY |
| 310(N-4) | DATA N-4 |
| 410(M-8) | INSTRUCTION: LOAD DATA FRAME 310(N-4) INTO DSR |
| 410(M-7) | INSTRUCTION: LOAD ADDRESS 220(N-4) INTO ASR |
| 410(M-6) | INSTRUCTION: LOAD DSR INTO CONFIGURATION MEMORY |
| 310(N-1) | DATA N-1 |
| 410(M-5) | INSTRUCTION: LOAD DATA FRAME 310(N-1) INTO DSR |
| 410(M-4) | INSTRUCTION: LOAD ADDRESS 220(N-1) INTO ASR |
| 410(M-3) | INSTRUCTION: LOAD DSR INTO CONFIGURATION MEMORY |
| 310(N) | DATA N |
| 410(M-2) | INSTRUCTION: LOAD DATA FRAME 310(N) INTO DSR |
| 410(M-1) | INSTRUCTION: LOAD ADDRESS 220(N) INTO ASR |
| 410(M) | INSTRUCTION: LOAD DSR INTO CONFIGURATION MEMORY |

*FIG. 4*

COMPRESSION AND DECOMPRESSION OF CONFIGURATION DATA USING REPEATED DATA FRAMES

TECHNICAL FIELD

The present invention relates generally to data compression and, more particularly, to compression and decompression of configuration data for programmable logic devices.

BACKGROUND

Programmable logic devices (PLDs), such as field programmable gate arrays (FPGAs) or complex programmable logic devices (CPLDs), may be programmed with configuration data to provide various user-defined features. For example, desired functionality may be achieved by programming a configuration memory of a PLD with an appropriate configuration data bitstream.

Unfortunately, the transfer of such bitstreams to PLDs or external memory devices is often cumbersome. In particular, the loading of large uncompressed bitstreams can result in undesirable delays. For example, a bitstream of 10M bits sent through a serial interface operating at 10 MHz may require approximately 1 second to load, and an 80M bit bitstream may require approximately 8 seconds to load. Such delays can significantly affect the time required to power up PLDs during operation and testing. In addition, the use of large capacity boot ROMs to store uncompressed bitstreams can further increase system costs.

Various data compression methods have been developed to reduce these problems associated with uncompressed bitstreams. For example, in one approach, bulk erase bytes (i.e., bytes comprised of eight erase bits) appearing within an 8 byte sequence of configuration data may be represented by an 8 bit header identifying the location of the bulk erase bytes within the sequence. Nevertheless, the compression attainable from this approach is highly dependent on the presence of large sets of continuous bulk erase bytes.

In another approach, adaptive pattern recognition techniques may be used to identify repeated data patterns in a bitstream. The data patterns are associated with brief data codes stored in a mapping table embedded in the beginning of a compressed bitstream, or included as part of a configuration data file. A decompression engine may read the mapping table and use it to de-compress incoming data. However, this approach requires the additional overhead associated with building, sending, and processing the mapping table for each bitstream.

Accordingly, there is a need for an improved approach to the compression of configuration data bitstreams. In particular, there is a need for an approach that is well-suited for use with PLDs.

SUMMARY

In accordance with one embodiment of the present invention, a method of converting an uncompressed bitstream into a compressed bitstream, wherein the uncompressed bitstream comprises configuration data in a plurality of data frames to configure a programmable logic device (PLD), includes embedding a first data frame from the uncompressed bitstream into the compressed bitstream, wherein the first data frame comprises a first data set; embedding a first instruction into the compressed bitstream to instruct the PLD to load the first data frame into a data shift register; embedding a second instruction into the compressed bitstream to instruct the PLD to load a first address associated with the first data frame into an address shift register; embedding a third instruction into the compressed bitstream to instruct the PLD to load the first data frame from the data shift register into a first row of a configuration memory corresponding to the first address; identifying a second data frame in the uncompressed bitstream, wherein the second data frame comprises the first data set; and embedding fourth and fifth instructions into the compressed bitstream in place of the second data frame, wherein: the fourth instruction is configured to instruct the PLD to load a second address associated with the second data frame into the address shift register, and the fifth instruction is configured to instruct the PLD to load the first data frame from the data shift register into a second row of the configuration memory corresponding to the second address.

In accordance with another embodiment of the present invention, a method of configuring programmable logic blocks of a programmable logic device (PLD) using configuration data in a plurality of data frames embedded in a compressed bitstream includes reading a first data frame from the compressed bitstream, wherein the first data frame comprises a first data set; executing a first instruction embedded in the compressed bitstream to instruct the PLD to load the first data frame into a data shift register; executing a second instruction embedded in the compressed bitstream to instruct the PLD to load a first address associated with the first data frame into an address shift register; executing a third instruction embedded in the compressed bitstream to instruct the PLD to load the first data frame from the data shift register into a first row of a configuration memory corresponding to the first address; executing a fourth instruction embedded in the compressed bitstream to instruct the PLD to load a second address associated with a second data frame into the address shift register, wherein the second data frame comprises the first data set; and executing a fifth instruction embedded in the compressed bitstream to instruct the PLD to load the first data frame from the data shift register into a second row of the configuration memory corresponding to the second address.

In accordance with another embodiment of the present invention, a programmable logic device (PLD) includes a plurality of programmable logic blocks; a configuration memory adapted to store configuration data to determine user-defined functionality of the programmable logic blocks; a data shift register; an address shift register; a data port adapted to receive a compressed bitstream comprising: a plurality of data frames comprising the configuration data, and a plurality of embedded instructions; and a configuration download engine adapted to: read a first data frame from the compressed bitstream, wherein the first data frame comprises a first data set, execute a first instruction embedded in the compressed bitstream to load the first data frame into the data shift register, execute a second instruction embedded in the compressed bitstream to load a first address associated with the first data frame into the address shift register, execute a third instruction embedded in the compressed bitstream to load the first data frame from the data shift register into a first row of the configuration memory corresponding to the first address, execute a fourth instruction embedded in the compressed bitstream to load a second address associated with a second data frame into the address shift register, wherein the second data frame comprises the first data set, and execute a fifth instruction embedded in the compressed bitstream to load the first data frame from the data shift register into a second row of the configuration memory corresponding to the second address.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIG. 4 illustrates an example of a compressed bitstream in accordance with an embodiment of the invention.

Embodiments of the present invention and their advantages are best understood by referring to the detailed description that follows. It should be appreciated that like reference numerals are used to identify like elements illustrated in one or more of the figures.

DETAILED DESCRIPTION

The various techniques disclosed herein are applicable to a wide variety of integrated circuits and applications. An exemplary implementation of a programmable logic device (PLD) will be utilized to illustrate the techniques in accordance with one or more embodiments of the present invention. However, it should be understood that this is not limiting and that the techniques disclosed herein may be implemented as desired, in accordance with one or more embodiments of the present invention, with various types of data and PLD implementations.

Figure 1:
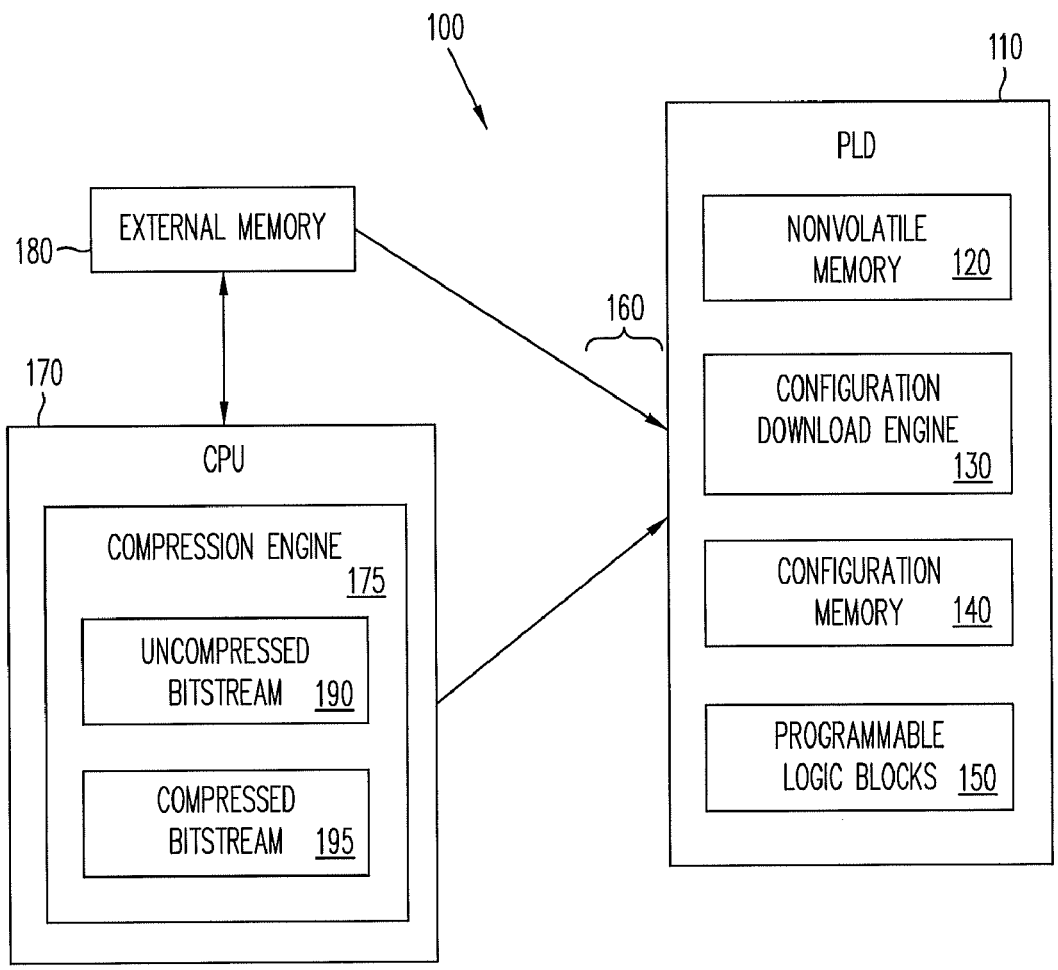
FIG. 1 illustrates a system for compressing, decompressing, and loading configuration data in accordance with an embodiment of the invention.

FIG. 1 illustrates a system 100 for compressing, decompressing, and loading configuration data in accordance with an embodiment of the invention. As shown, system 100 includes a programmable logic device (PLD) 110, a computing device 170 (labeled "CPU"), and an external memory 180. It should be understood that the number and placement of the various elements of PLD 110, computing device 170, and external memory 180 in FIG. 1 is not limiting and may depend upon the desired application. Furthermore, it should be understood that the elements are illustrated in block form for clarity.

As further described herein, computing device 170 includes a compression engine 175 that may be operated to convert an uncompressed bitstream 190 (e.g., a configuration data bitstream prepared by computing device 170 and/or received from external memory 180) into a compressed bitstream 195. In this regard, uncompressed bitstream 190 may include configuration data implemented as a plurality of data frames that are used to configure logic blocks of PLD 110. A data frame typically contains configuration data for configuring a portion of each of the logic blocks in a row of a PLD (or column, depending upon the PLD structure). Multiple consecutive data frames are thus commonly used to complete the configuration of the logic blocks in a row.

Compression engine 175 may process uncompressed bitstream 190 to identify repeated instances of identical data frames within uncompressed bitstream 190. Such identical data frames may be used, for example, where multiple programmable logic blocks are configured to provide the same functionality (e.g., where programmable logic blocks are configured to provide wide data busses with the same functionality for multiple bits), where multiple programmable logic blocks are unused, or other appropriate configurations.

Compression engine 175 may create compressed bitstream 195 by embedding selected data frames (e.g., only a single instance of each unique data frame) from uncompressed bitstream 190, and further embedding instructions to control the loading of such data frames into configuration memory 140 of PLD 110. Advantageously, such instructions may be subsequently used by PLD 110 to control the loading of data frames into configuration memory without requiring multiple encodings of repeated data frames in compressed bitstream 195.

In one embodiment, each data frame included in uncompressed bitstream 190 may include approximately 2000 to 10000 bytes. In contrast, the instructions embedded to control the loading of a repeated data frame may include less than approximately 1000 bytes. As a result, compressed bitstream 195 can exhibit significant compression over uncompressed bitstream 190 in implementations where individual data frames are repeated within uncompressed bitstream 190.

Compression engine 175 may be implemented by one or more processors of computing device 170 configured with appropriate software (e.g., a computer program for execution by a computer), stored on a computer-readable medium, configured to instruct the one or more processors to perform one or more of the operations described herein to provide a software-based compression engine. In another embodiment, compression engine 175 may be implemented by dedicated hardware of computing device 170. In yet another embodiment, compression engine 175 may be implemented by a combination of software and hardware.

Computing device 170 may provide compressed bitstream 195 to PLD 110 and/or external memory 180 for storage. PLD 110 may be implemented to process compressed bitstream 195 for configuring logic blocks of PLD 110. Advantageously, the transfer of compressed bitstream 195 between computing device 170, external memory 180, and/or PLD 110 can reduce delays associated with such transfers using uncompressed bitstream 190.

As shown, PLD 110 (e.g., an FPGA) includes data ports 160 that may be used by PLD 110 to communicate with computing device 170 and/or external memory 180. For example, data ports 160 may be used to receive configuration data and/or commands from computing device 170 and/or external memory 180. In one embodiment, data ports 160 may be implemented as one or more serial peripheral interface (SPI) ports. As understood by those skilled in the art, SPI is a serial interface standard established by Motorola Corporation of Schaumburg, Ill. In another embodiment, data ports 160 may be implemented as one or more joint test action group (JTAG) ports employing standards such as Institute of Electrical and Electronics Engineers (IEEE) 1149.1 and/or IEEE 1532 standards.

PLD 110 includes programmable logic blocks 150 (e.g., also referred to in the art as configurable logic blocks or logic array blocks) to provide logic functionality for PLD 110, such as, for example, LUT-based logic typically associated with FPGAs. The configuration of programmable logic blocks 150 is determined by the configuration data stored in configuration memory 140 (e.g., block SRAM).

PLD 110 further includes a configuration download engine 130 which may receive a compressed bitstream received by PLD 110 from computing device 170 and/or external memory 180. Configuration download engine 130 may decompress compressed bitstream 195 and control the loading of embedded configuration data into configuration memory 140 of PLD 110.

In one embodiment, configuration download engine 130 may be implemented by one or more processors configured with appropriate software (e.g., a computer program for execution by a computer), stored on a computer-readable medium, configured to instruct the one or more processors to perform one or more of the operations described herein. In another embodiment, configuration download engine 130 may be implemented by dedicated hardware to perform such operations. In another embodiment, configuration download engine 130 may be implemented to perform such operations using a combination of software and hardware. In another embodiment, configuration download engine 130 may be implemented by some of programmable logic blocks 150 of PLD 110.

PLD 110 may optionally include reprogrammable non-volatile memory 120 (e.g., blocks of EEPROM or flash memory). In one embodiment, non-volatile memory 120 may be used to store uncompressed bitstream 190 within PLD 110 for transfer to configuration memory 140 of PLD 110 upon power up or during reconfiguration of PLD 110. In another embodiment, non-volatile memory 120 may be used to store compressed bitstream 195 which may be subsequently processed by configuration download engine 130 for loading embedded configuration data into configuration memory 140.

External memory 180 may be implemented, for example, as a non-volatile memory (e.g., an SPI serial flash memory) which may be used to store uncompressed bitstream 190 and/or compressed bitstream 195 to be loaded into PLD 110 through data ports 160.

Figure 2:
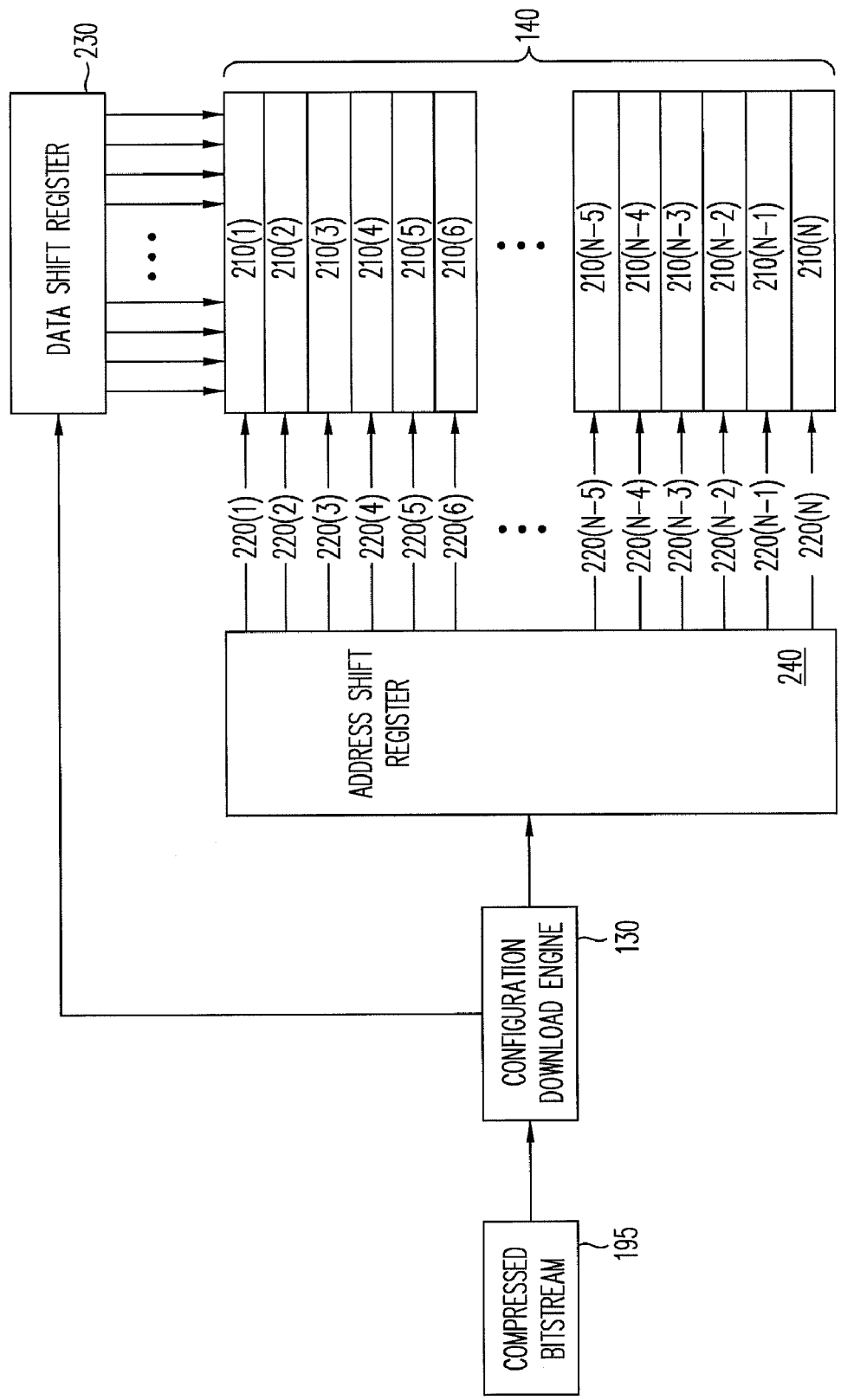
FIG. 2 illustrates various portions of a PLD for loading configuration data into a configuration memory in accordance with an embodiment of the invention.

FIG. 2 illustrates various portions of PLD 110 for loading configuration data into configuration memory 140 in accordance with an embodiment of the invention. As shown, PLD 110 includes configuration download engine 130 and configuration memory 140 as previously described with regard to FIG. 1. In addition, PLD 110 includes a data shift register (DSR) 230 and an address shift register (ASR) 240 which may be controlled by configuration download engine 130 to load data frames embedded in compressed bitstream 195 into configuration memory 140.

Configuration memory 140 may be implemented with a plurality of rows 210 (labeled 210(1) to 210(N)), there being multiple rows of configuration memory within a row of programmable logic blocks. As noted previously, each row of configuration memory may store a data frame for configuring a portion of programmable logic blocks 150. Each of rows 210(1) to 210(N) has a corresponding address 220(1) to 220(N), respectively, which, when loaded into ASR 240, may be used to select one of rows 210 for loading configuration data. In this regard, configuration download engine 130 may load a data frame into DSR 230 and also load an address into ASR 240. Appropriate write circuitry of PLD 110 may load the contents of DSR 230 into the particular one of rows 210(1) to 210(N) corresponding to the address in ASR 240. By providing different addresses to ASR 240, the contents of DSR 230 may be successively loaded into multiple individual rows 210 of configuration memory 140.

Configuration download engine 130 may receive compressed bitstream 195 from, for example, computing device 170 or external memory 180 (e.g., through data ports 160), or from nonvolatile memory 120. In response to various instructions embedded in compressed bitstream 195, configuration download engine 130 may control the loading of configuration data into configuration memory 140 by providing individual data frames and corresponding addresses to DSR 230 and ASR 240, respectively.

Figure 3:
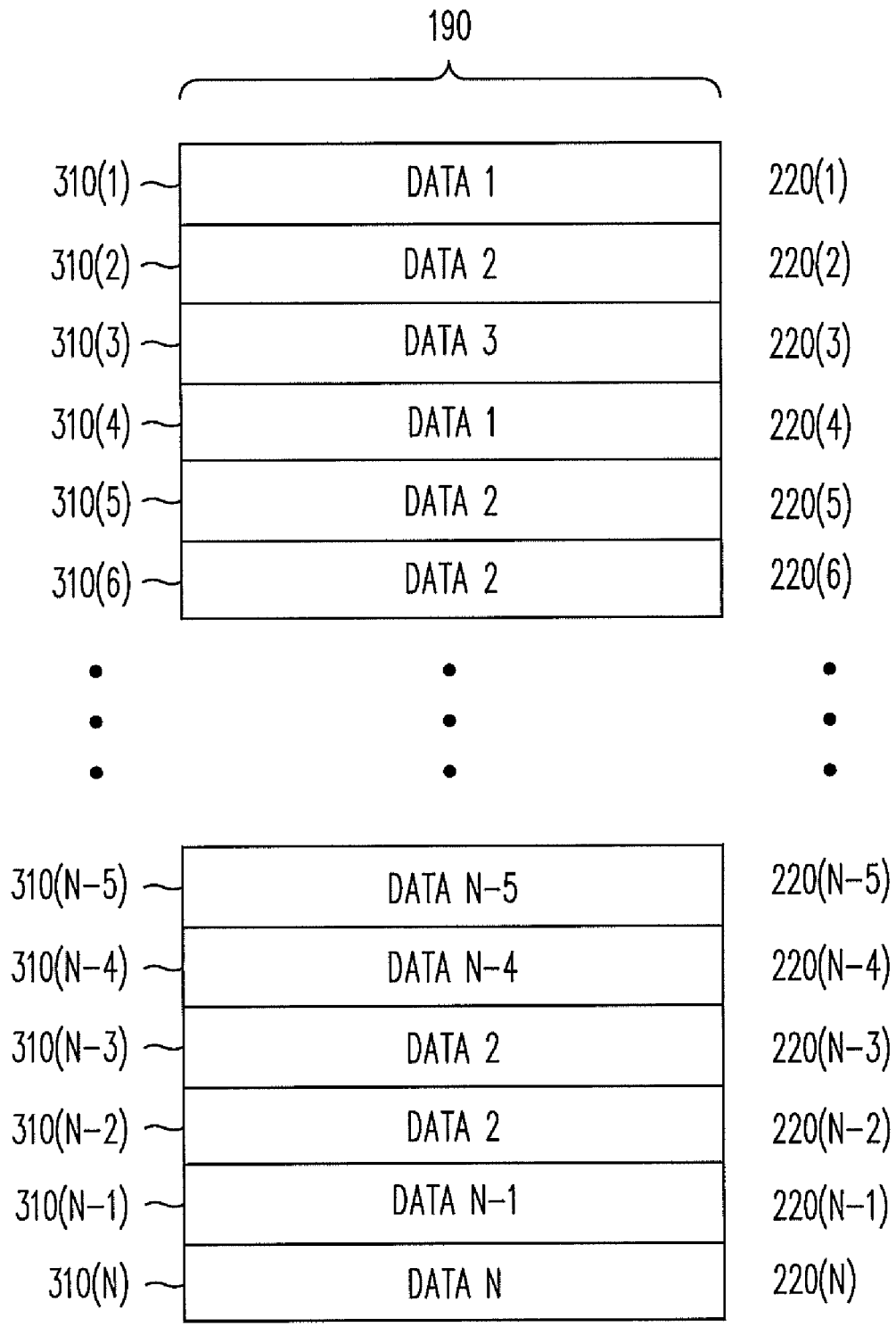
FIG. 3 illustrates an example of an uncompressed bitstream in accordance with an embodiment of the invention.

FIG. 3 illustrates one embodiment of uncompressed bitstream 190. As shown, uncompressed bitstream 300 includes a plurality of data frames 310 (labeled 310(1) to 310(N)), each of which is associated with a corresponding address 220 (labeled 220(1) to 220(N)) of rows 210 of configuration memory 140. Accordingly, it will be appreciated that uncompressed bitstream 300 may be loaded into configuration memory 140 of PLD 110 to configure programmable logic blocks 150.

Individual data frames 310 include various data sets which are represented generically in FIG. 3 in block form, and some of data frames 310 include the same data sets. For example, data frames 310(1) and 310(4) both include "Data 1"; data frames 310(2), 310(5), 310(6), 310(N-3), and 310(N-2) all include "Data 2"; and data frames 310(3), 310(N-5), 310(N-4), 310(N-1), and 310(N) each include "Data 3," "Data N-5," "Data N-4," "Data N-1," and "Data N," respectively. It will be appreciated that uncompressed bitstream 190 may include additional data frames with corresponding data sets between data frames 310(6) and 310(N-5).

In the particular embodiment illustrated in FIG. 3, individual data frames 310 are associated with individual rows 210. However, in another embodiments, each row 210 may be implemented to receive multiple data frames 310. In such cases, groups of consecutive data frames may be loaded into individual rows 210 of configuration memory 140, with subsequent groups of consecutive data frames loaded into subsequent rows.

FIG. 4 illustrates one embodiment of compressed bitstream 195 which has been prepared by compression engine 175 using the embodiment of uncompressed bitstream 190 shown in FIG. 3. As illustrated in FIG. 4, compressed bitstream 195 includes various data frames 310 of uncompressed bitstream 190, as well as various embedded instructions 410 (labeled 410(1) to 410(M)) which may be executed by configuration download engine 130 to control the loading of such data frames 310 into configuration memory 140 of PLD 110, as further described herein. It will be appreciated that compressed bitstream 195 may include additional data frames with corresponding data sets, and/or additional instructions, between instruction 410(19) and data frame 310(N-5).

Figure 5:
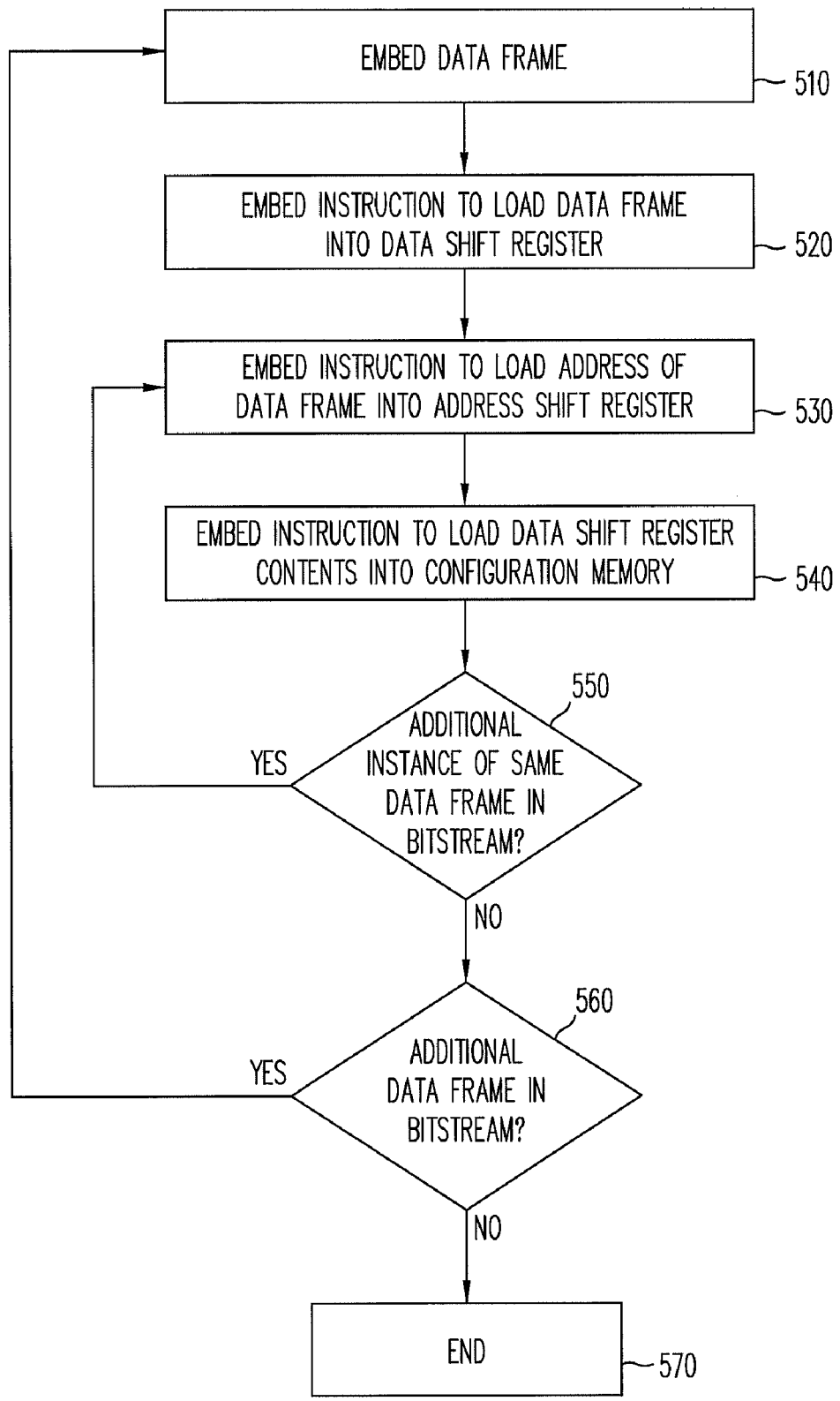
FIG. 5 illustrates a process of converting an uncompressed bitstream into a compressed bitstream in accordance with an embodiment of the invention.

FIG. 5 illustrates a process performed by compression engine 175 to convert uncompressed bitstream 190 into compressed bitstream 195 in accordance with an embodiment of the invention. For purposes of example, the process of FIG. 5 will be described with regard to the embodiments of uncompressed bitstream 190 and compressed bitstream 195 illustrated in FIGS. 3 and 4, respectively.

In step 510, starting with the first data frame 310(1) of uncompressed bitstream 190, compression engine 175 embeds data frame 310(1) into compressed bitstream 195. In step 520, compression engine 175 embeds an instruction 410(1) to load data frame 310(1) into DSR 230.

In step 530, compression engine 175 embeds an instruction 410(2) to load the corresponding address 220(1) of data frame 310(1) into ASR 240. In the embodiment shown in FIG. 5, step 520 is illustrated as being performed before step 530. However, the order of steps 530 and step 520 may be changed in various embodiments. For example, in another embodiment, step 520 may be performed following step 530 and prior to step 540. In such an embodiment, step 520 need not be repeated during subsequent iterations of steps 530 to 550.

In step 540, compression engine 175 embeds an instruction 410(3) to load the contents of DSR 230 (currently storing "Data 1" of data frame 310(1)) into the row of configuration memory 140 specified by ASR 240 (currently storing address 220(1)).

In step 550, compression engine 175 determines whether additional data frames 310 of uncompressed bitstream 190 include the same data set as the current data frame 310(1). As previously discussed, data frame 310(4) also includes "Data 1." Accordingly, the process of FIG. 5 returns to step 530 where instruction 410(4) is embedded to load address 220(4) of data frame 310(4) which is the next occurrence of "Data 1." Then, in step 540, compression engine embeds an instruction 410(5) to load the contents of DSR 230 (currently storing "Data 1" shared by data frames 310(1) and 310(4)) into the row of configuration memory 140 specified by ASR 240 (currently storing address 220(4)).

As shown in FIG. 3, no additional instances of "Data 1" are present in uncompressed bitstream 190 (step 550). Accordingly, the process continues to step 560.

In step 560, compression engine 175 determines whether any additional data frames 310 of uncompressed bitstream 190 remain to be processed. In this example, it will be appreciated that data frames 310(2), (3), and (5) to (N) remain to be processed. Accordingly, the process returns to step 510 where the next unprocessed data frame (in this case, data frame 310(2)) will be embedded.

The various steps 510 to 560 can be performed in the manner described above to process data frames 310(2), (3), and (5) to (N). As a result, compression engine 175 will embed additional data frames 310(2), 310(3), 310(N-5), 310(N-4), 310(N-1), and 310(N), and instructions 410(6) to 410(M) into compressed bitstream 195. After all data frames 310 of uncompressed bitstream 190 have been processed (step 560), then the process of FIG. 5 will end (step 570).

Figure 6:
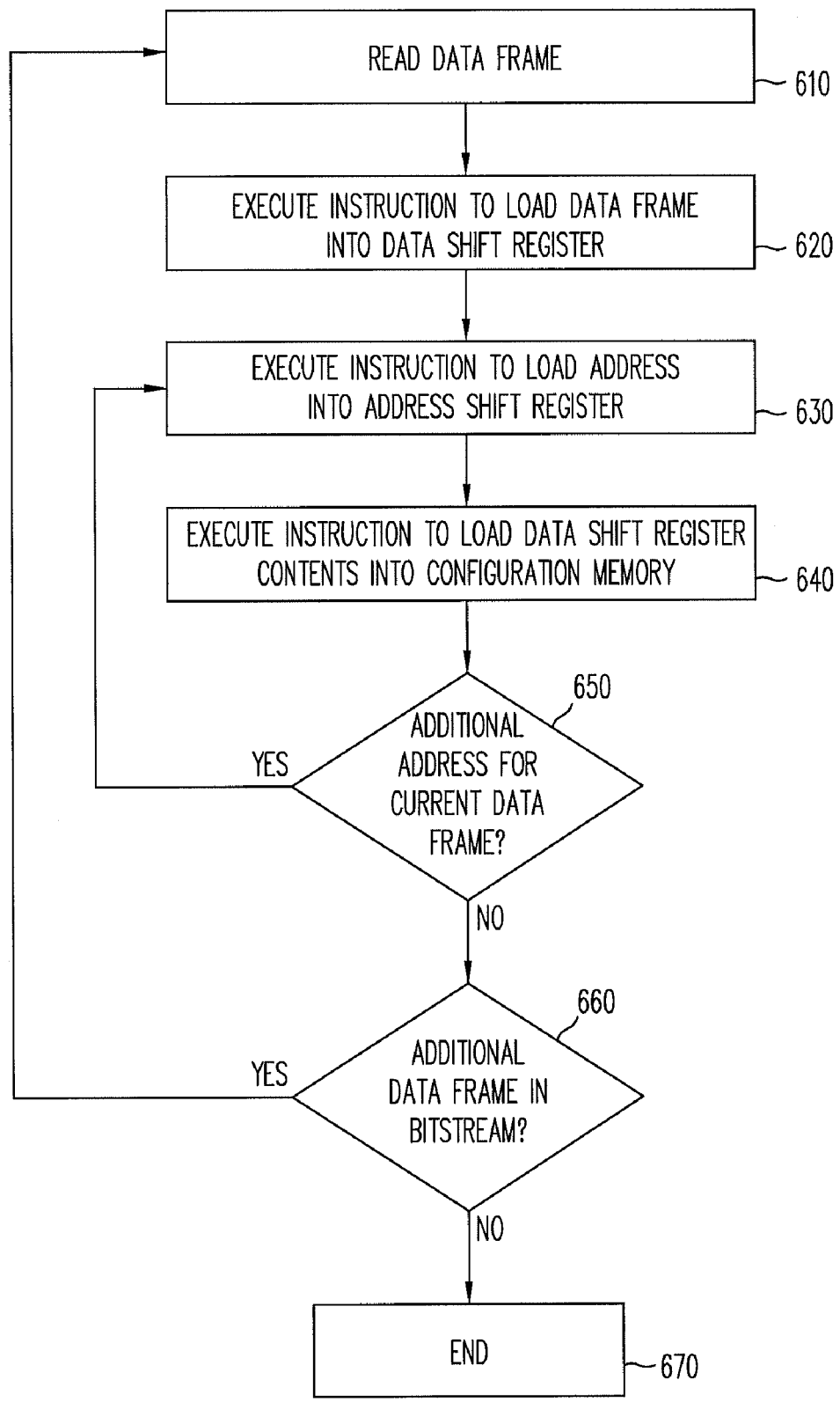
FIG. 6 illustrates a process of decompressing a compressed bitstream and loading configuration data into a configuration memory of a PLD accordance with an embodiment of the invention.

FIG. 6 illustrates a process performed by configuration download engine 130 to decompress compressed bitstream 195 and load configuration data into configuration memory 140 of a PLD 110 in accordance with an embodiment of the invention. For purposes of example, the process of FIG. 6 will be described with regard to the embodiment of compressed bitstream 195 illustrated in FIG. 4. As further described below, configuration download engine 130 may process compressed bitstream 195 sequentially in order to load all embedded configuration data into appropriate rows 210 of configuration memory 140.

For example, in step 610, configuration download engine 130 reads the first data frame 310(1) embedded in uncompressed bitstream 190. Then, in step 620, configuration download engine 130 executes instruction 410(1) to load data frame 310(1) into DSR 230. In step 630, configuration download engine 130 executes instruction 410(2) to load address 220(1) into ASR 240.

In step 640, configuration download engine 130 executes instruction 410(3) to load the contents of DSR 230 (currently storing "Data 1" of data frame 310(1)) into the row of configuration memory 140 specified by ASR 240 (currently storing address 220(1)). Accordingly, it will be appreciated that following step 640, configuration download engine 130 will have caused data frame 310(1) to be loaded into row 210(1) of configuration memory 140.

In step 650, configuration download engine 130 determines whether any additional addresses remain to be loaded for the current data frame 310(1). As shown in FIG. 4, compressed bitstream 195 includes an additional instruction 410(4) corresponding to another address 220(4) of configuration memory 140 into which the current data frame 310(1) should be loaded. Accordingly, the process of FIG. 6 returns to step 630 where configuration download engine 130 executes instruction 410(4) to load address 220(4) into ASR 240.

The process then continues again to step 640 where configuration download engine 130 executes instruction 410(5) to load the contents of DSR 230 into the row of configuration memory 140 specified by ASR 240. It will be appreciated that at this time, DSR 230 continues to store data frame 310(1) that was loaded during previous step 620. Also at this time, ASR 240 stores address 220(4) that was loaded in the most recent iteration of step 630. Accordingly, in step 640, data frame 310(1) will be loaded into row 210(4) of configuration memory 140, corresponding to address 220(4).

The process continues again to step 650 where configuration download engine 130 determines whether any additional addresses remain to be loaded for the current data frame 310(1). As shown in FIG. 4, compressed bitstream 195 includes no additional instructions corresponding to the current data frame 310(1). Accordingly, the process of FIG. 6 continues to step 660.

In step 660, configuration download engine 130 determines whether any additional data frames 310 are embedded in compressed bitstream 195. As shown in the example of FIG. 4, compressed bitstream 195 includes additional data frames 310(2), 310(3), 310(N-5), 310(N-4), 310(N-1), and 310(N). Accordingly, the process of FIG. 6 returns to step 610 where the next data frame (in this case, data frame 310(2)) will be read.

The various steps 610 to 660 can be performed in the manner described above to read the remaining data frames 310(2), 310(3), 310(N-5), 310(N-4), 310(N-1), and 310(N), and execute the remaining instructions 410(6) to 410(M) to load all remaining rows 210(2), 210(3), and 210(5) to 210(N) with configuration data. After all data frames 310 and instructions 410 of compressed bitstream 195 have been processed (step 660), then the process of FIG. 6 will end (step 670).

In view of the present disclosure, it will be appreciated that various data compression and decompression techniques disclosed herein may be used to reduce the size of configuration data bitstreams having repeated data frames. In particular, significant data compression can be achieved in applications where the size of repeated data frames exceeds the size of instructions used to control the loading of the repeated data frames into configuration memory of a PLD. Moreover, because the disclosed techniques may be used on a frame by frame basis and do not require the contents of individual data frames to be changed, such techniques may advantageously be combined with other existing data compression schemes that may operate on individual frames as well.

Embodiments described above illustrate but do not limit the invention. It should also be understood that numerous modifications and variations are possible in accordance with the principles of the present invention. Accordingly, the scope of the invention is defined only by the following claims.

We claim:

1. A method of converting an uncompressed bitstream into a compressed bitstream, wherein the uncompressed bitstream comprises configuration data in a plurality of data frames to configure a programmable logic device (PLD), the method comprising:

embedding a first data frame from the uncompressed bitstream into the compressed bitstream, wherein the first data frame comprises a first data set;

embedding a first instruction into the compressed bitstream to instruct the PLD to load the first data frame into a data shift register;

embedding a second instruction into the compressed bitstream to instruct the PLD to load a first address associated with the first data frame into an address shift register;

embedding a third instruction into the compressed bitstream to instruct the PLD to load the first data frame from the data shift register into a first row of a configuration memory corresponding to the first address;

identifying a second data frame in the uncompressed bitstream, wherein the second data frame comprises the first data set; and embedding fourth and fifth instructions into the compressed bitstream in place of the second data frame, wherein:

the fourth instruction is configured to instruct the PLD to load a second address associated with the second data frame into the address shift register, and the fifth instruction is configured to instruct the PLD to load the first data frame from the data shift register into a second row of the configuration memory corresponding to the second address.

2. The method of claim 1, wherein the compressed bitstream comprises only a single instance of the first data set.

3. The method of claim 1, wherein the fourth and fifth instructions collectively comprise a smaller number of bits than the second data frame.

4. The method of claim 1, further comprising passing the compressed bitstream to the PLD.

5. The method of claim 1, further comprising:

embedding a third data frame from the uncompressed bitstream into the compressed bitstream, wherein the third data frame comprises a second data set that differs from the first data set;

embedding a sixth instruction into the compressed bitstream to instruct the PLD to load the third data frame into the data shift register;

embedding a seventh instruction into the compressed bitstream to instruct the PLD to load a third address associated with the third data frame into the address shift register; and embedding an eighth instruction into the compressed bitstream to instruct the PLD to load the third data frame from the data shift register into a third row of the configuration memory corresponding to the third address.

6. The method of claim 5, further comprising:

identifying a fourth data frame in the uncompressed bitstream, wherein the fourth data frame comprises the second data set; and embedding ninth and tenth instructions into the compressed bitstream in place of the fourth data frame, wherein:

the ninth instruction is configured to instruct the PLD to load a fourth address associated with the fourth data frame into the address shift register, and the tenth instruction is configured to instruct the PLD to load the third data frame from the data shift register into a fourth row of the configuration memory corresponding to the fourth address.

7. A method of configuring programmable logic blocks of a programmable logic device (PLD) using configuration data in a plurality of data frames embedded in a compressed bitstream, the method comprising:

reading a first data frame from the compressed bitstream, wherein the first data frame comprises a first data set;

executing a first instruction embedded in the compressed bitstream to instruct the PLD to load the first data frame into a data shift register;

executing a second instruction embedded in the compressed bitstream to instruct the PLD to load a first address associated with the first data frame into an address shift register;

executing a third instruction embedded in the compressed bitstream to instruct the PLD to load the first data frame from the data shift register into a first row of a configuration memory corresponding to the first address;

executing a fourth instruction embedded in the compressed bitstream to instruct the PLD to load a second address associated with a second data frame into the address shift register, wherein the second data frame comprises the first data set; and executing a fifth instruction embedded in the compressed bitstream to instruct the PLD to load the first data frame from the data shift register into a second row of the configuration memory corresponding to the second address.

8. The method of claim 7, wherein the compressed bitstream comprises only a single instance of the first data set.

9. The method of claim 7, wherein the fourth and fifth instructions collectively comprise a smaller number of bits than the second data frame.

10. The method of claim 7, further comprising receiving the compressed bitstream at a data port of the PLD from a computing device external to the PLD.

11. The method of claim 7, further comprising receiving the compressed bitstream at a data port of the PLD from a memory external to the PLD.

12. The method of claim 7, further comprising:

reading a third data frame from the compressed bitstream, wherein the third data frame comprises a second data set that differs from the first data set;

executing a sixth instruction embedded in the compressed bitstream to instruct the PLD to load the third data frame into the data shift register;

executing a seventh instruction embedded in the compressed bitstream to instruct the PLD to load a third address associated with the third data frame into the address shift register; and executing an eighth instruction embedded in the compressed bitstream to instruct the PLD to load the third data frame from the data shift register into a third row of the configuration memory corresponding to the third address.

13. The method of claim 12, further comprising:

executing a ninth instruction embedded in the compressed bitstream to instruct the PLD to load a fourth address associated with a fourth data frame into the address shift register, wherein the fourth data frame comprises the second data set; and executing a tenth instruction embedded in the compressed bitstream to instruct the PLD to load the third data frame from the data shift register into a fourth row of the configuration memory corresponding to the fourth address.

14. A programmable logic device (PLD) comprising:

a plurality of programmable logic blocks;

a configuration memory adapted to store configuration data to determine user-defined functionality of the programmable logic blocks;

a data shift register;

an address shift register;

a data port adapted to receive a compressed bitstream comprising:
    a plurality of data frames comprising the configuration data, and
    a plurality of embedded instructions; and
a configuration download engine adapted to:
    read a first data frame from the compressed bitstream, wherein the first data frame comprises a first data set,
    execute a first instruction embedded in the compressed bitstream to load the first data frame into the data shift register,
    execute a second instruction embedded in the compressed bitstream to load a first address associated with the first data frame into the address shift register,
execute a third instruction embedded in the compressed bitstream to load the first data frame from the data shift register into a first row of the configuration memory corresponding to the first address,
    execute a fourth instruction embedded in the compressed bitstream to load a second address associated with a second data frame into the address shift register, wherein the second data frame comprises the first data set, and
    execute a fifth instruction embedded in the compressed bitstream to load the first data frame from the data shift register into a second row of the configuration memory corresponding to the second address.

15. The PLD of claim 14, wherein the compressed bitstream comprises only a single instance of the first data set.

16. The PLD of claim 14, wherein the fourth and fifth instructions collectively comprise a smaller number of bits than the second data frame.

17. The PLD of claim 14, wherein the configuration download engine is further adapted to:
    read a third data frame from the compressed bitstream, wherein the third data frame comprises a second data set that differs from the first data set;
    execute a sixth instruction embedded in the compressed bitstream to load the third data frame into the data shift register;
    execute a seventh instruction embedded in the compressed bitstream to load a third address associated with the third data frame into the address shift register; and
    execute an eighth instruction embedded in the compressed bitstream to load the third data frame from the data shift register into a third row of the configuration memory corresponding to the third address.

18. The PLD of claim 17, wherein the configuration download engine is further adapted to:
    execute a ninth instruction embedded in the compressed bitstream to load a fourth address associated with a fourth data frame into the address shift register, wherein the fourth data frame comprises the second data set; and
    execute a tenth instruction embedded in the compressed bitstream to load the third data frame from the data shift register into a fourth row of the configuration memory corresponding to the fourth address.

* * * * *